US012648230B2

(12) United States Patent
Tylaite et al.

(10) Patent No.: US 12,648,230 B2
(45) Date of Patent: Jun. 2, 2026

(54) UNIDIRECTIONAL ESD PROTECTION WITH LATERAL AND VERTICAL DEVICE

(71) Applicant: Infineon Technologies AG, Neubiberg (DE)

(72) Inventors: Egle Tylaite, Munich (DE); Vadim Valentinovic Vendt, Munich (DE); Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 796 days.

(21) Appl. No.: 17/941,684

(22) Filed: Sep. 9, 2022

(65) Prior Publication Data

US 2023/0080466 A1 Mar. 16, 2023

Related U.S. Application Data

(60) Provisional application No. 63/243,503, filed on Sep. 13, 2021.

(51) Int. Cl.
*H10D 89/60* (2025.01)
*H02H 9/04* (2006.01)
*H10W 42/60* (2026.01)

(52) U.S. Cl.
CPC .......... *H10D 89/611* (2025.01); *H02H 9/046* (2013.01); *H10D 89/711* (2025.01); *H10W 42/60* (2026.01)

(58) Field of Classification Search
CPC ...... H10D 89/611; H10D 8/411; H10D 8/422; H10D 8/022; H10D 8/024; H10D 8/20; H10D 8/25; H10D 8/50; H10D 8/412;

H10D 89/60; H10D 84/148; H10D 84/158; H10D 89/711; H10D 89/931; H01L 23/60; H02H 9/046; H10W 42/60
See application file for complete search history.

(56) References Cited

U.S. PATENT DOCUMENTS

| | | | | |
|---|---|---|---|---|
| 5,324,971 | A | * 6/1994 | Notley | H10D 89/611 |
| | | | | 257/490 |
| 8,766,415 | B2 | 7/2014 | Schmenn et al. | |
| 9,177,950 | B2 | 11/2015 | Schmenn et al. | |
| 10,090,294 | B2 * | 10/2018 | Nishida | H10D 64/516 |
| 10,741,548 | B2 | 8/2020 | Vendt et al. | |
| 11,271,099 | B2 * | 3/2022 | Yeh | H10D 89/60 |
| 11,276,688 | B2 * | 3/2022 | Shukla | H10D 8/022 |

(Continued)

FOREIGN PATENT DOCUMENTS

CN 113130477 A 7/2021

*Primary Examiner* — Yara B Green
*Assistant Examiner* — Benjamin Michael Kupp
(74) *Attorney, Agent, or Firm* — Murphy, Bilak & Homiller, PLLC

(57) ABSTRACT

A semiconductor device includes a semiconductor body, first and second contact pads disposed on an upper surface of the semiconductor body, a lateral ESD protection device formed in the semiconductor body, and a vertical ESD protection device formed in the semiconductor body, wherein the lateral ESD protection device and the vertical ESD protection device together form a unidirectional device between the first and second contact pads, and wherein the lateral ESD protection device is formed in a first portion of the semiconductor body that is laterally electrically isolated from a vertical current path of the vertical ESD protection device.

17 Claims, 3 Drawing Sheets

(56)        References Cited

U.S. PATENT DOCUMENTS

| | | | |
|---|---|---|---|
| 11,437,365 B2* | 9/2022 | Laconde | .............. H10D 89/611 |
| 2020/0321330 A1 | 10/2020 | Laconde et al. | |
| 2020/0335494 A1 | 10/2020 | Vendt et al. | |
| 2021/0098572 A1 | 4/2021 | Watanabe | |

* cited by examiner

UNIDIRECTIONAL ESD PROTECTION WITH LATERAL AND VERTICAL DEVICE

TECHNICAL FIELD

The instant application relates to semiconductor devices, and more particularly relates to ESD protection devices.

BACKGROUND

Components such as transistors, diodes, resistors, electro-optical devices, precision film resistors and a variety of integrated circuits are all sensitive to electrostatic discharge (ESD). As electronics manufacturers drive to miniaturize devices and improve operating speeds, vulnerability of devices to ESD is increasing. Devices are subject to ESD damage at every stage of production. For avoiding damage to integrated circuits or electronic devices by pulses during assembly or operation, ESD protection devices are connected between pins of an integrated circuit in order to prevent a malfunction or breakdown of circuits. ESD protection devices operate by permitting a voltage to deviate within a safe operation voltage range and clamping the voltage when it falls outside of the safe operation voltage.

Some pins of integrated circuits or lines in electronic systems are very susceptible to negative ESD strikes and require low clamping voltages in the negative polarity, while requiring a relatively higher clamping voltages in the positive polarity. Moreover, these circuits may require the ESD protection device to have low capacitance and/or small device footprint. Conventional ESD protection solutions for meeting these goals come with conflicting tradeoffs. Accordingly, there is a need to provide a unidirectional ESD protection device with the lowest possible capacitance, smallest possible package footprint, and lowest cost.

SUMMARY

Those skilled in the art will recognize additional features and advantages upon reading the following detailed description, and upon viewing the accompanying drawings.

A semiconductor device is disclosed. According to an embodiment, the semiconductor device comprises a semiconductor body, first and second contact pads disposed on an upper surface of the semiconductor body, a lateral ESD protection device formed in the semiconductor body, and a vertical ESD protection device formed in the semiconductor body, wherein the lateral ESD protection device and the vertical ESD protection device together form a unidirectional device between the first and second contact pads, wherein the lateral ESD protection device is formed in a first portion of the semiconductor body, wherein the vertical ESD protection device is formed in second and third portions of the semiconductor body, and wherein the second and third portions of the semiconductor body are electrically isolated from the first portion of the semiconductor body.

Separately or in combination, a negative clamping voltage of the unidirectional device at a negative bias between the first and second contact pads is defined by the lateral ESD protection device, and wherein a positive clamping voltage of the unidirectional device at a positive bias between the first and second contact pads is defined by the vertical ESD protection device.

Separately or in combination, the semiconductor body comprises a base substrate and an epitaxial layer disposed on the base substrate, and wherein the vertical current path of the vertical ESD protection device comprises a current between the first contact pad and the base substrate and a current between the second contact pad and the base substrate.

Separately or in combination, the lateral ESD protection device comprises a p-type region that is formed in the upper surface of the semiconductor body and is in low-ohmic contact with the second contact pad, an n-type region that is formed in the upper surface of the semiconductor body and is in low-ohmic contact with the first contact pad; and a section of the epitaxial layer which has a lower net dopant concentration as the p-type region and the n-type region and is disposed between the p-type region and the n-type region.

Separately or in combination, the lateral ESD protection device comprises a plurality of the p-type regions and a plurality of the n-type regions.

Separately or in combination, the p-type regions and the n-type regions each have an elongated geometry, and the p-type regions and the n-type regions alternate with one another in a first direction that is perpendicular to elongated sides of the p-type regions and the n-type regions.

Separately or in combination, the vertical ESD protection device comprises an n-type region that is formed in the upper surface of the semiconductor body and is in low-ohmic contact with the second contact pad, a p-type region that is formed in the upper surface of the semiconductor body and is in low-ohmic contact with the first contact pad, a buried n-type region that is disposed within the epitaxial layer or within the base substrate under the p-type region and has a higher net dopant concentration than the epitaxial layer, and a buried p-type region that is disposed within the epitaxial layer or within the base substrate under the n-type region and has a higher net dopant concentration than the epitaxial layer.

Separately or in combination, the buried p-type region and a semiconductor region of the epitaxial layer or the base substrate below the buried p-type region form a p-n junction with one another, and wherein the p-n junction is configured as an avalanche diode or a Zener diode.

Separately or in combination, the current between the first contact pad and the base substrate flows through a second portion of the semiconductor body that is at least laterally electrically isolated from the first portion of the semiconductor body, wherein the current between the second contact pad and the base substrate flows through a third portion of the semiconductor body that is at least laterally electrically isolated from the first portion of the semiconductor body.

Separately or in combination, the semiconductor device comprises electrical isolation structures that extend from the upper surface to the base substrate, wherein the electrical isolation structures electrically laterally isolate each of the first, second and third portions of the semiconductor body from one another, and wherein each of the electrical isolation structures comprise one or more trenches that are filled with dielectric material.

Separately or in combination, the second portion of the semiconductor body is completely isolated from the first portion of the semiconductor body and the third portion of the semiconductor body, and wherein the second portion of the semiconductor body is vertically electrically isolated from the base substrate by blocking p-n junction.

Separately or in combination, in a first area of the semiconductor body the first portion is interposed between the second and third portions of the semiconductor body, and wherein in a second area of the semiconductor body the second and third portions of the semiconductor body are arranged on immediate opposite sides of one of the electrical isolation structures.

A semiconductor device comprises a semiconductor body, first and second contact pads disposed on an upper surface of the semiconductor body, a lateral PIN diode connected between the first and second contact pads, a series connected vertical device structure connected between the first and second contact pads, wherein the lateral PIN diode is configured to conduct in a forward operating mode at negative bias between the first and second contact pads, and wherein the series connected vertical device structure comprises a first blocking diode that is configured to conduct in a reverse blocking mode at positive bias between the first and second contact pads.

Separately or in combination, the lateral PIN diode is disposed within a first portion of the semiconductor body that is laterally electrically isolated from a vertical current path of the series connected vertical device structure and is vertically electrically isolated from a base substrate of the semiconductor device.

Separately or in combination, the series connected vertical device structure comprises a first vertical PIN diode, and an open base bipolar transistor, and wherein the open base bipolar transistor forms a vertical voltage blocking structure at positive bias between the first and second contact pads.

Separately or in combination, the first vertical PIN diode is disposed within a second portion of the semiconductor body, wherein the open base bipolar transistor is disposed within a third portion of the semiconductor body, wherein the semiconductor device further comprises one or more electrical isolation structures that electrically isolate each of the first, second and third portions of the semiconductor body from one another.

Separately or in combination, wherein the one or more electrical isolation structures are arranged such that in a second area of the semiconductor body current flowing between the first vertical PIN diode and the open base bipolar transistor does not flow directly underneath the lateral PIN diode.

Separately or in combination, wherein the first blocking diode comprises any one of: a Zener diode, a Schottky diode, and a PIN diode.

Separately or in combination, the lateral PIN diode and the series connected vertical device structure together form a unidirectional device between the first and second contact pads, wherein a negative clamping voltage of the unidirectional device at a negative bias between the first and second contact pads is determined by a forward conducting voltage of the lateral PIN diode, and wherein a positive clamping voltage of the unidirectional device at a positive bias between the first and second contact pads is determined by a reverse conducting voltage of the first blocking diode.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIG. 1A schematically illustrates a cross-sectional view of a semiconductor body comprising the protection device, and FIG. 1B illustrates an equivalent circuit schematic of the protection device.

DETAILED DESCRIPTION

Embodiments of a unidirectional protection device that comprises a lateral ESD protection device and a vertical ESD protection device are described herein. The lateral ESD protection device and the vertical ESD protection device are connected in parallel between first and second contact pads of the device. The lateral ESD protection device may be a lateral diode that is arranged so that a forward conduction voltage of the lateral diode defines the negative clamping voltage of the unidirectional protection device. The vertical ESD protection is arranged so that a blocking voltage of a vertical blocking device in the conduction path of the vertical ESD protection device defines the positive clamping voltage of the unidirectional protection device. By using these two different devices to define the different clamping voltages, the properties of the lateral and vertical devices, e.g., conducting voltage, capacitance, etc., can be tailored independent from one another. Moreover, the arrangement is space efficient, as the region accommodating the lateral protection device can be arranged in an interior area of the semiconductor body between the same contact pads that connect with the vertical protection device. The arrangement also allows for both contact pads of the protection device to be provided on a single upper surface of the semiconductor body. As a result, the device can be provided in a so-called chip-scale-package, which is a particular type of semiconductor package that is smaller and less expensive than other packaging technologies.

Figures 1A, 1B:
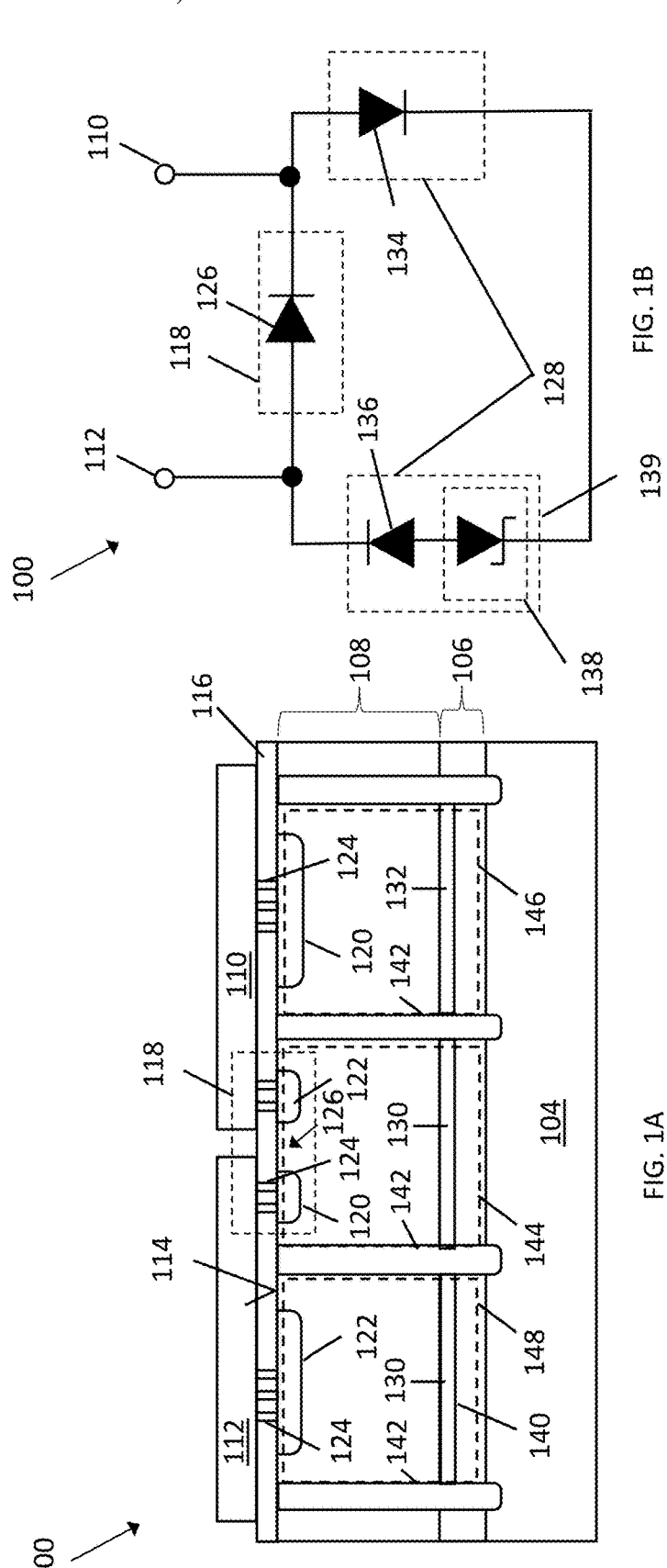
FIGS. 1A and 1B, illustrates a protection device, according to an embodiment.

Referring to FIG. 1, a semiconductor device 100 is formed in a semiconductor body 102. The semiconductor device 100 may be a discrete device such that no other elements are formed in the semiconductor body 102. Alternatively, the semiconductor device 100 may be part of an integrated circuit such that other electrical elements are formed in regions of the semiconductor body 102 that are not depicted. Generally speaking, the semiconductor body 102 may include or consist of a semiconductor material from group IV elemental semiconductors, IV-IV compound semiconductor material, III-V compound semiconductor material, Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs).

The semiconductor body 102 comprises a base substrate 104, and an epitaxial layer 108 disposed on the base substrate 104 and extending to the upper surface 114 of the semiconductor body 102. According to an embodiment, the base substrate 104 is a highly doped n-type region with a net dopant concentration of between $10^{18}$ dopant atoms/cm$^3$ and $10^{20}$ dopant atoms/cm$^3$. The semiconductor body 102 may additionally comprise a buried region 106 disposed between the base substrate 104 and the epitaxial layer 108. The buried region 106 has the same conductivity type as the subjacent semiconductor material of the base substrate 104 and has a lower net dopant concentration than the base substrate 104. For example, the buried region 106 may have a net dopant concentration of between $10^{15}$ dopant atoms/cm$^3$ and $10^{18}$ dopant atoms/cm$^3$. The epitaxial layer 108 has a net dopant concentration that is lower than that of the base substrate 104 and the buried region 106. For example, the epitaxial layer 108 may have a dopant concentration of no greater than $10^{15}$ dopant atoms/cm$^3$ and more typically in the range of $10^{12}$ dopant atoms/cm$^3$ to $10^{13}$ dopant atoms/cm$^3$, which may correspond to the intrinsic dopant concentration of semiconductor material that does not receive active or intentional doping processes. The dopant concentration of the epitaxial layer 108 may be a net p-type dopant concentration or a net n-type dopant concentration. The base substrate 104 may correspond to a bulk semiconductor wafer, e.g., a silicon wafer. According to one embodiment, the buried region 106 is a sub-layer of the epitaxial layer 108 that is epitaxially formed on the base substrate 104. According to another embodiment, the buried region 106 is part of the base substrate 104 itself. The buried region 106 may be doped by implantation into the base substrate 104 or into a first epitaxially formed layer on the base substrate 104, followed by subsequent thermal anneal before or after deposition of an epitaxially deposited epitaxial layer 108. The base substrate 104 may extend to a rear surface of the semiconductor body 102 that is opposite from the upper surface 114. Alternatively, the base substrate 104 may be disposed on another region of semiconductor, conductive metal or isolating material (not shown) which extends to the rear surface of the semiconductor body 102.

The semiconductor device 100 comprises first and second contact pads 110, 112 disposed on an upper surface 114 of the semiconductor body 102. The first and second contact pads 110, 112 may each be formed from an electrically conductive material, e.g., copper, aluminum, nickel, and alloys thereof. The first and second contact pads 110, 112 may be configured as externally accessible points of electrical contact that can be contacted by an interconnect structure such as a bond wire, clip, ribbon, solder etc. Alternatively, the first and second contact pads 110, 112 can correspond to interior regions of metallization that are connected to other contact pads that are electrically accessible for external connection. An interlayer dielectric 116 is provided between the upper surface 114 of the semiconductor body 102 and the first and second contact pads 110, 112. The interlayer dielectric 116 may comprise an electrically insulating material such as SiO$_2$ (silicon dioxide), SiN (silicon nitride), SiOxN$_y$ (silicon oxynitride), etc.

The semiconductor device 100 comprises a lateral ESD protection device 118 formed in the semiconductor body 102. The lateral ESD protection device 118 comprises a p-type region 120 that is formed in the upper surface 114 of the semiconductor body 102 and an n-type region 122 that is formed in the upper surface 114 of the semiconductor body 102. The p-type region 120 and the n-type region 122 of the lateral ESD protection device 118 may be doped wells that are formed by implanting dopant atoms into the upper surface 114 of the semiconductor body 102, for example. The p-type region 120 of the lateral ESD protection device 118 may have a net p-type dopant concentration of at $10^{19}$ dopant atoms/cm$^3$ to $10^{21}$ dopant atoms/cm$^3$, for example. The n-type region 122 of the lateral ESD protection device 118 may have a net n-type dopant concentration of at $10^{19}$ dopant atoms/cm$^3$ to $10^{21}$ dopant atoms/cm$^3$, for example. The p-type region 120 of the lateral ESD protection device 118 is in low-ohmic (i.e., non-rectifying) contact with the second contact pad 112 and the n-type region 122 of the lateral ESD protection device 118 is in low-ohmic (i.e., non-rectifying) contact with the first contact pad 110. To this end, the semiconductor device 100 may comprise electrically conductive via structures 124, e.g., vias comprising tungsten, nickel, etc., extending through the interlayer dielectric 116 and providing the necessary electrical connections to the first and second contact pads 110, 112.

The lateral ESD protection device 118 may additionally comprise a section 126 of the epitaxial layer 108 which has a lower net dopant concentration as the p-type region 120 and the n-type region 122 and is disposed between the p-type region 120 and the n-type region 122. As previously explained, the epitaxial layer 108 may have a very low doping concentration. Accordingly, the section of the epitaxial layer 108 which separates the p-type region 120 and the n-type region 122 of the lateral ESD protection device 118 may have a dopant concentration of no greater than $10^{15}$ dopant atoms/cm$^3$ and more typically in the range of $10^{12}$ dopant atoms/cm$^3$ to $10^{13}$ dopant atoms/cm$^3$. This arrangement results in the lateral ESD protection device 118 being configured as a lateral PIN diode 126 that is connected between the first and second contact pads 110, 112. A PIN diode refers to a type of diode that comprises an intrinsic semiconductor region, e.g., a region of relatively low doped or undoped doped semiconductor material, interposed between a p-type anode region and an n-type cathode region. In the case of the lateral PIN diode 126, the section of the epitaxial layer 108 corresponds to the intrinsic semiconductor region of the diode. In a conventionally known manner, the lateral PIN diode 126 is configured to conduct in a forward operating mode when a voltage across the anode and cathode terminals of the PIN diode exceeds its forward operating voltage. In this regard, physical parameters such as length of the intrinsic region, i.e., the section of the epitaxial layer 108 between the p-type region 120 and the n-type region 122, doping of the intrinsic region, and doping concentrations of the p-type region 120 and the n-type region 122 may be selected to produce a specific forward operating voltage.

The semiconductor device 100 additionally comprises a vertical ESD protection device 128 formed in the semiconductor body 102. The vertical ESD protection device 128 comprises an n-type region 122 that is formed in the upper surface 114 of the semiconductor body 102 and a p-type region 120 that is formed in the upper surface 114 of the semiconductor body 102. The p-type region 120 and the n-type region 122 of the vertical ESD protection device 128 may be formed by implanting dopant atoms into the upper surface 114 of the semiconductor body 102, for example. The p-type region 120 of the vertical ESD protection device 128 may have a net p-type dopant concentration of between $10^{19}$ dopant atoms/cm$^3$ to $10^{21}$ dopant atoms/cm$^3$, for example. The n-type region 122 of the vertical ESD protection device 128 may have a net n-type dopant concentration of between $10^{19}$ dopant atoms/cm$^3$ to $10^{21}$ dopant atoms/cm$^3$, for example. The n-type region 122 of vertical ESD protection device 128 is in low-ohmic (i.e., non-rectifying) contact with the second contact pad 112 and the p-type region 120 of vertical ESD protection device 128 is in low-ohmic (i.e., non-rectifying) contact with the first contact pad 110.

The vertical ESD protection device 128 comprises a buried p-type region 130 that is disposed within the buried region 106 and has a higher net dopant concentration than the buried region 106, and a buried n-type region 132 that is disposed within the buried region 106 and has a higher net dopant concentration than the buried region 106. The buried p-type region 130 may have a net p-type dopant concentration of at least $10^{15}$ dopant atoms/cm$^3$ and more typically in the range of $10^{17}$ dopant atoms/cm$^3$ to $10^{19}$ dopant atoms/cm$^3$, for example. The buried n-type region 132 may have a net n-type dopant concentration of at least $10^{15}$ dopant atoms/cm$^3$ and more typically in the range of $10^{17}$ dopant atoms/cm$^3$ to $10^{19}$ dopant atoms/cm$^3$, for example.

The vertical ESD protection device 128 may comprise a first vertical PIN diode 134 that is formed by the p-type region 120 and the buried n-type region 132 of the vertical ESD protection device 128. This first vertical PIN diode 134 is connected between the first contact pad 110 and the base substrate 104, with the vertical section of the epitaxial layer 108 interposed between the p-type region 120 and the buried n-type region 132 of the vertical ESD protection device 128 providing the intrinsic semiconductor region of the first vertical PIN diode 134.

The vertical ESD protection device 128 comprises a vertical voltage blocking structure 139 that is connected between the base substrate 104 and the second contact pad 112. The vertical voltage blocking structure 139 comprises a first blocking diode 138. The first blocking diode 138 is arranged to be parallel with the lateral ESD protection device 118. The reverse breakdown voltage of the first blocking diode 138 is lower than the reverse breakdown voltage of the lateral ESD protection device 118, such that in case of a positive voltage between pad 110 and pad 112 the lateral ESD protection device 118 will not break down while the vertical blocking diode breaks down and enters into a conducting mode. In the depicted embodiment, the vertical voltage blocking structure 139 comprises an NPN structure from the n-type base substrate 104, the buried region 106, the buried p-type region 130, and the n-type regions 122. This NPN structure forms an open base bipolar transistor, wherein a blocking junction of the open base bipolar transistor corresponds to the p-n junction between the buried p-type region 130 and the buried region 106 below the buried p-type region 130 and the forward conducting junction of the open base bipolar transistor correspond to a second vertical PIN diode 136 that is formed by the n-type region 122, the buried p-type region 130 and the intermediate epitaxial region 108. The dopant concentration the buried p-type region 130 and the dopant concentration and thickness of the region of the epitaxial layer 108 or the base substrate 106 below the buried p-type region 130 may be selected such that the blocking junction of the open base bipolar transistor, i.e., the first blocking diode 138, is an avalanche diode or a Zener diode, for example.

The semiconductor device 100 comprises electrical isolation structures 142 that extend from the upper surface to the base substrate 104. These electrical isolation structures 142 may comprise any dielectric material or region with electrically insulating properties. For example, the electrical isolation structures 142 may comprise oxides, nitrides, oxynitrides, e.g., $SiO_2$ (silicon dioxide), SiN (silicon nitride), SiOxNy (silicon oxynitride), for example. These electrical insulators can be formed by a trench that extends from the upper surface 114 to the base substrate 104 or extending into the base substrate 104 to a depth of in the range of 1 to 10 μm, and is filled with one or more dielectric materials, e.g., according to a so-called deep trench isolation (DTI) technique. As shown, each electrical isolation structure 142 is provided by a single trench. Alternatively, the electrical isolation structures 142 may comprise two or more trenches that are collectively arranged between isolated portions of the semiconductor body, with an electrically inactive region of semiconductor material disposed between each pair of trenches.

Figure 2:
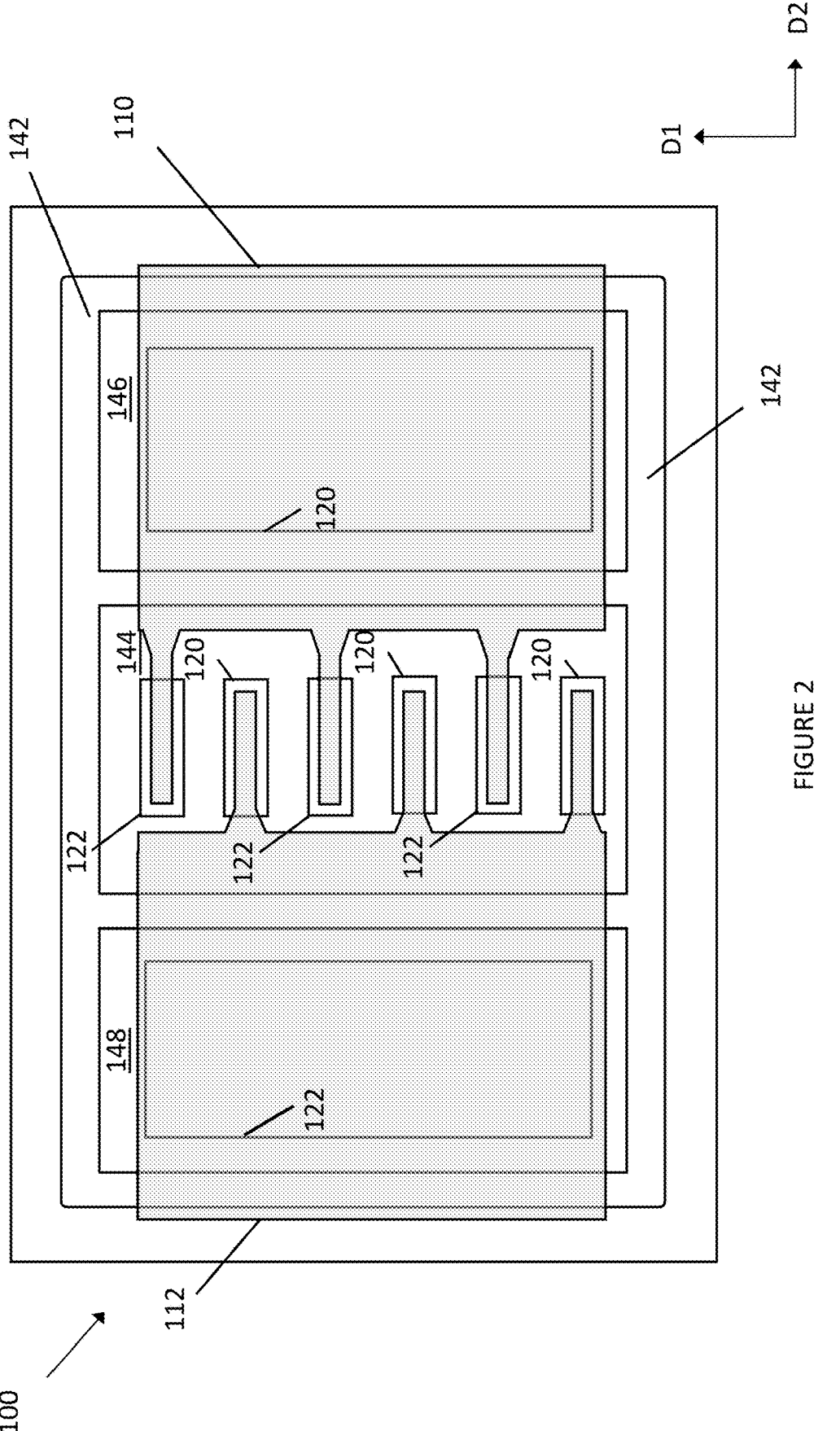
FIG. 2 illustrates a plan-view layout of a semiconductor body comprising a protection device, according to an embodiment.
Figure 3:
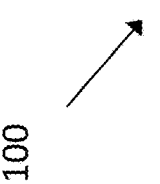
FIG. 3 illustrates a plan-view layout of a semiconductor body comprising a protection device, according to an embodiment.
Figure 3:
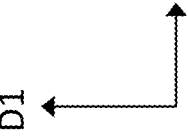

The electrical isolation structures 142 define first, second and third portions 144, 146, 148 of the semiconductor body 102 that are laterally electrically isolated from one another. That is, electrical isolation structures 142 prohibit a lateral current above the base substrate 104 from flowing between any one of the first, second and third portions 144, 146, 148 in a lateral direction that is parallel to the upper surface 114 of the semiconductor body 102. As can be seen in FIGS. 2 and 3, the electrical isolation structures 142 may form a complete enclosed ring around each of the first, second and third portions 144, 146, 148 from a plan-view of the semiconductor body 102. The p-type region 120 and the n-type region 122 of the lateral ESD protection device 118 are disposed in the first portion 144 of the semiconductor body 102. Thus, the lateral ESD protection device 118 is laterally electrically isolated from the second and third portions 146, 148 of the semiconductor body 102. The p-type region 120 and the buried n-type region 132 of the vertical ESD protection device 128 is disposed in the second portion 146 of the semiconductor body 102. Thus, the first vertical PIN diode 134 is laterally electrically isolated from the first and third portions 144, 148 of the semiconductor body 102. The n-type region 122 and the buried p-type region 130 of the vertical ESD protection device 128 are disposed in the third portion 148 of the semiconductor body 102. Thus, the vertical voltage blocking structure 139 is laterally electrically isolated from the first and second portions 144, 146 of the semiconductor body 102.

The working principle of the semiconductor device 100 is as follows. The lateral ESD protection device 118 and the vertical ESD protection device 128 collectively form a unidirectional protection device between the first and second contact pads 110, 112. A unidirectional protection device refers to a device with an asymmetrical current-voltage characteristics wherein the turn-on voltages of the devices is different in the forward direction than in the reverse direction. In this device, the negative clamping voltage of the unidirectional protection device at a negative bias between the first and second contact pads 110, 112 is defined by the lateral ESD protection device 118. When the negative bias between the first and second contact pads 110, 112 exceeds the forward conduction voltage of the lateral ESD protection device 118, the lateral ESD protection device 118 operates in a forward conduction mode. The positive clamping voltage of the unidirectional protection device at a positive bias between the first and second contact pads 110, 112 is defined by the vertical ESD protection device 128. The current path of the vertical ESD protection device 128 comprises a vertical current flowing from the first contact pad 110 to the base substrate 104 via the first vertical PIN diode 134, a current flowing from the first vertical PIN diode 134 to the vertical voltage blocking structure 139 via the base substrate 104, and a vertical current flowing from the base substrate 104 to the second contact pad 112 via the vertical voltage blocking structure 139. When the vertical voltage blocking structure 139 is turned on such that the first blocking diode 138 is reverse conducting and the second vertical PIN diode 136 is forward conducting, the semiconductor device 100 clamps the voltage between the first and second contact pads 110, 112. The properties of the blocking junction of the open base bipolar transistor can therefore be tailored to determine the positive clamping voltage of the semiconductor device 100.

Other types of rectification devices may be used to define a positive clamping voltage of the unidirectional protection device. For instance, in other embodiments, the vertical ESD protection device 128 comprises any one or more of: a Zener diode, an open base bipolar transistor (i.e., an NPN or PNP structure), a thyristor (i.e., an NPNP or PNPN structure), a vertical MOSFET device, a vertical DMOS device, or a Schottky contact (i.e., metal semiconductor-contact), wherein these devices are connected in series with between the first and second contact pads 110, 112. These devices may be integrated into the buried region 106 or formed at other locations in the current path of the vertical ESD protection device 128, in the second and third portions 146, 148 of the semiconductor body 102.

Due to the lateral electrical isolation provided by the electrical isolation structures 142, the lateral ESD protection device 118 is laterally electrically isolated from the vertical current path of the vertical ESD protection device 128. That is, vertical current flowing from the first contact pad 110 to the base substrate 104 via the first vertical PIN diode 134 does not interfere with the operation of the lateral ESD protection device 118, nor does the vertical current flowing from the base substrate 104 to the second contact pad 112 via the second vertical PIN diode 136 and the first voltage blocking diode 138. The electrical isolation concept therefor allows for a space-efficient design wherein the two devices can be arranged in an overlapping area the semiconductor body 102. The current of the vertical ESD protection device 128 that flows via the base substrate 104 may be isolated from the lateral current of the lateral ESD protection device 118 by a blocking pn-junction between the first portion 144 of the semiconductor body 102 and the base substrate 104 e.g., by a further buried p-type region 130 disposed in the first portion 144 of the semiconductor body 102. This buried p-type region 130 disposed in the first portion 144 of the semiconductor body 102 forms a vertical p-n diode. However, the characteristics of the p-n junction 140 can be selected such that the first blocking diode 138 enters reverse conduction mode before this p-n diode and the first blocking diode 138 establishes the preferred path for conduction of the positive ESD current pulse between the first and second contact pads 110, 112. In other words, the vertical p-n diode disposed in the first portion 144 does not impact the clamping voltage of the semiconductor device 100.

Referring to FIG. 2, a layout of the semiconductor device 100 is shown. As can be seen, the lateral ESD protection device 118 may comprise a plurality of the p-type regions 120 and a plurality of the n-type regions 122. The p-type regions 120 and the n-type regions 122 can be arranged in a group to alternate with one another in a first direction D1 of the semiconductor body 102. That is, the p-type regions 120 and the n-type regions 122 are arranged such that a cross-sectional plane extending in the first direction D1 intersects one of the p-type regions 120, followed by one of the n-type regions 122, followed by one of the p-type regions 120, and so forth. Each of the p-type regions 120 and the n-type regions 122 may have an elongated geometry, meaning that the p-type regions 120 and the n-type regions 122 comprise longer sides and shorter sides. As shown, the p-type regions and the n-type regions 122 have an elongated rectangle geometry, with elongated sidewalls of the p-type regions 120 and the n-type regions 122 running in a second direction D2 that is perpendicular to the first direction D1. Stated another way, the p-type regions 120 and the n-type regions 122 have an interleaved finger configuration, wherein the current flow in the first portion 144 of the semiconductor body 102 is directed along the first direction D1 between the elongated sides of the p-type regions 120 and the n-type regions 122. This finger concept can be used to tailor with great precision the properties of the lateral ESD protection device 118, e.g., forward current-voltage characteristics and clamping voltage, through selection of size and spacing of the p-type regions 120 and the n-type regions 122. As shown, the p-type regions 120 and the n-type regions 122 can be contacted with the first and second contact pads 110, 112 by conductive runners that extend over the p-type regions 120 and the n-type regions 122. The conductive runners may be formed from an electrically conductive material, e.g., copper, aluminum, nickel, and alloys thereof, or highly doped polysilicon. Moreover, a variety of metallization configurations are possible to form the necessary electrical connections with the first and second contact pads 110, 112 using one or more levels of metallization.

Referring to FIG. 3, a layout of the semiconductor device 100 is shown, according to another embodiment. For the sake of simplicity, the first and second contact pads 110, 112 are omitted from FIG. 3. In this embodiment, the electrical isolation structures 142 are arranged such that in first areas 150 of the semiconductor body 102 the first portion 144 of the semiconductor body 102 is interposed between the second and third portions 146, 148 of the semiconductor body 102, and in second areas 152 of the semiconductor body 102 the second and third portions 146, 148 of the semiconductor body 102 are arranged on immediate opposite sides of one of the electrical isolation structures 142. Thus, different from the layout shown in FIG. 2, the second portion 146 of the semiconductor body 102 is not completely separated from the third portion 148 of the semiconductor body 102 by the first portion 144 of the semiconductor body 102. Instead, there is a span of the electrical isolation structures 142 that forms an immediate line of division between the second portion 146 and the third portion 148. This arrangement shortens the current path of the vertical ESD protection device 128 by providing areas wherein current can flow directly between the second portion 146 and the third portion 148 via the base substrate 104 without having to traverse underneath the first portion 144. Stated another way, the layout of FIG. 3 lowers the resistance of the connection between the first vertical PIN diode 134 and vertical blocking structure 139 by eliminating the width of the region comprising the lateral ESD protection device 118 as part of the current path.

A "lateral" device as used herein refers to semiconductor device which conducts exclusively in a lateral direction that is parallel to a main surface of a semiconductor substrate. By contrast, a "vertical" device as used herein refers to semiconductor device which conducts at least partially in a vertical direction that is perpendicular to a main surface of a semiconductor substrate.

The present specification refers to a "first" and a "second" conductivity type of dopants. These terms refer to the majority carrier type of doped semiconductor regions. The present specification also refers to n-type semiconductor regions, i.e., semiconductor regions with a net n-type majority carrier concentration, and p-type semiconductor regions, i.e., semiconductor regions with a net p-type majority carrier concentration. In any of the embodiments described herein, the doping types may be reversed to obtain a device that operates on a similar working principle. For example, an n-type device may be converted to a p-type device by changing the n-type regions to p-type regions, and vice-versa. The polarity of any diode structure may be reversed by changing the n-type regions to p-type regions, and vice-versa. The present specification encompasses all such embodiments.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device, comprising:
a semiconductor body;
first and second contact pads disposed on an upper surface of the semiconductor body;
a lateral ESD protection device formed in the semiconductor body; and
a vertical ESD protection device formed in the semiconductor body;
wherein the lateral ESD protection device and the vertical ESD protection device together form a unidirectional device between the first and second contact pads,
wherein the lateral ESD protection device is formed in a first portion of the semiconductor body,
wherein the vertical ESD protection device is formed in second and third portions of the semiconductor body, and
wherein the second and third portions of the semiconductor body are electrically isolated from the first portion of the semiconductor body,
wherein the first portion of the semiconductor body is laterally in between the second and third portions of the semiconductor body,
wherein the vertical ESD protection device comprises an n-type region that is formed in the upper surface of the semiconductor body in the third portion of the semiconductor body and is in low-ohmic contact with the second contact pad and a p-type region that is formed in the upper surface of the semiconductor body in the second portion of the semiconductor body and is in low-ohmic contact with the first contact pad, and
wherein a current path of the vertical ESD protection device comprises a vertical current flowing within the second portion of the semiconductor body from the first contact pad to a base substrate, a current flowing between the second portion of the semiconductor body and the third portion of the semiconductor body via the base substrate, and a vertical current flowing from the base substrate to the first contact pad within the third portion of the semiconductor body.

2. The semiconductor device of claim 1, wherein a negative clamping voltage of the unidirectional device at a negative bias between the first and second contact pads is defined by the lateral ESD protection device, and wherein a positive clamping voltage of the unidirectional device at a positive bias between the first and second contact pads is defined by the vertical ESD protection device.

3. The semiconductor device of claim 1, wherein the lateral ESD protection device comprises:
a p-type region that is formed in the upper surface of the semiconductor body within the first portion of the semiconductor body and is in low-ohmic contact with the second contact pad;
an n-type region that is formed in the upper surface of the semiconductor body within the first portion of the semiconductor body and is in low-ohmic contact with the first contact pad; and
a section of the epitaxial layer which has a lower net dopant concentration than the p-type region and the n-type region and is disposed between the p-type region and the n-type region.

4. The semiconductor device of claim 3, wherein the lateral ESD protection device comprises a plurality of the p-type regions and a plurality of the n-type regions.

5. The semiconductor device of claim 4, wherein the p-type regions and the n-type regions each have an elongated geometry, and wherein the p-type regions and the n-type regions alternate with one another in a first direction that is perpendicular to elongated sides of the p-type regions and the n-type regions.

6. The semiconductor device of claim 1, wherein the vertical ESD protection device comprises:
a buried n-type region that is disposed within the epitaxial layer or within the base substrate under the p-type region and has a higher net dopant concentration than the epitaxial layer, and
a buried p-type region that is disposed within the epitaxial layer or within the base substrate under the n-type region and has a higher net dopant concentration than the epitaxial layer.

7. The semiconductor device of claim 6, wherein the buried p-type region and a semiconductor region of the epitaxial layer or the base substrate below the buried p-type region form a p-n junction with one another, and wherein the p-n junction is configured as an avalanche diode or a Zener diode.

8. The semiconductor device of claim 1, wherein the semiconductor device comprises electrical isolation structures that extend from the upper surface of the semiconductor body to the base substrate, wherein the electrical isolation structures electrically laterally isolate each of the first, second and third portions of the semiconductor body from one another, and wherein each of the electrical isolation structures comprise one or more trenches that are filled with dielectric material.

9. The semiconductor device of claim 8, wherein the second portion of the semiconductor body is completely isolated from the first portion of the semiconductor body and the third portion of the semiconductor body, and wherein the second portion of the semiconductor body is vertically electrically isolated from the base substrate by blocking p-n junction.

10. The semiconductor device of claim 8, wherein in a first area of the semiconductor body the first portion is interposed between the second and third portions of the semiconductor body, and wherein in a second area of the semiconductor body the second and third portions of the semiconductor body are arranged on immediate opposite sides of one of the electrical isolation structures.

11. A semiconductor device, comprising:

a semiconductor body;

first and second contact pads disposed on an upper surface of the semiconductor body;

a lateral PIN diode connected between the first and second contact pads;

a series connected vertical device structure connected between the first and second contact pads, wherein the lateral PIN diode is configured to conduct in a forward operating mode at negative bias between the first and second contact pads, and wherein the series connected vertical device structure comprises a first blocking diode that is configured to conduct in a reverse blocking mode at positive bias between the first and second contact pads, wherein the lateral PIN diode is disposed within a first portion of the semiconductor body that is laterally electrically isolated from a vertical current path of the series connected vertical device structure and is vertically electrically isolated from a base substrate of the semiconductor device.

12. The semiconductor device of claim 11, wherein the series connected vertical device structure comprises a first vertical PIN diode, and an open base bipolar transistor, and wherein the open base bipolar transistor forms a vertical voltage blocking structure at positive bias between the first and second contact pads.

13. The semiconductor device of claim 12, wherein the first vertical PIN diode is disposed within a second portion of the semiconductor body, wherein the open base bipolar transistor is disposed within a third portion of the semiconductor body, wherein the semiconductor device further comprises one or more electrical isolation structures that electrically isolate each of the first, second and third portions of the semiconductor body from one another.

14. The semiconductor device of claim 13, wherein the one or more electrical isolation structures are arranged such that in a second area of the semiconductor body current flowing between the first vertical PIN diode and the open base bipolar transistor does not flow directly underneath the lateral PIN diode.

15. The semiconductor device of claim 11, wherein the first blocking diode comprises any one of: a Zener diode, a Schottky diode, and a PIN diode.

16. The semiconductor device of claim 11, wherein the lateral PIN diode and the series connected vertical device structure together form a unidirectional device between the first and second contact pads, wherein a negative clamping voltage of the unidirectional device at a negative bias between the first and second contact pads is determined by a forward conducting voltage of the lateral PIN diode, and wherein a positive clamping voltage of the unidirectional device at a positive bias between the first and second contact pads is determined by a reverse conducting voltage of the first blocking diode.

17. A semiconductor device, comprising:

a semiconductor body;

first and second contact pads disposed on an upper surface of the semiconductor body;

a lateral ESD protection device formed in the semiconductor body; and a vertical ESD protection device formed in the semiconductor body;

wherein the lateral ESD protection device and the vertical ESD protection device together form a unidirectional device between the first and second contact pads, wherein the lateral ESD protection device is formed in a first portion of the semiconductor body, wherein the vertical ESD protection device is formed in second and third portions of the semiconductor body, and wherein the second and third portions of the semiconductor body are electrically isolated from the first portion of the semiconductor body, wherein the semiconductor device comprises electrical isolation structures that extend from the upper surface of the semiconductor body to the base substrate, wherein the electrical isolation structures electrically laterally isolate each of the first, second and third portions of the semiconductor body from one another, and wherein each of the electrical isolation structures comprise one or more trenches that are filled with dielectric material, wherein in a first area of the semiconductor body the first portion is interposed between the second and third portions of the semiconductor body, and wherein in a second area of the semiconductor body the second and third portions of the semiconductor body are arranged on immediate opposite sides of one of the electrical isolation structures.

\*　　\*　　\*　　\*　　\*